(12) United States Patent
Hann et al.

(10) Patent No.: US 6,630,903 B1
(45) Date of Patent: Oct. 7, 2003

(54) PROGRAMMABLE POWER REGULATOR FOR MEDIUM TO HIGH POWER RF AMPLIFIERS WITH VARIABLE FREQUENCY APPLICATIONS

(75) Inventors: Raymond Eugene Hann, San Bernardino, CA (US); James John Polston, Palmdale, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 14 days.

(21) Appl. No.: 09/964,380

(22) Filed: Sep. 28, 2001

(51) Int. Cl.$^7$ ................................................. G01S 7/28
(52) U.S. Cl. ...................... 342/175; 342/199; 342/203; 323/277; 327/541; 330/252
(58) Field of Search ................ 342/175, 199, 342/200, 201, 202, 203, 204, 82, 83, 84, 85, 86, 87, 88; 323/223, 236, 238, 277, 281, 284, 293, 243, 283, 902; 324/537, 73.1, 133, 99 D; 327/349, 447, 463, 518, 539, 541, 543, 581

(56) References Cited

U.S. PATENT DOCUMENTS

| | | | | |
|---|---|---|---|---|
| 3,743,923 A | * | 7/1973 | Steudel | ................ 323/281 |
| 4,035,716 A | | 7/1977 | Hutchinson | |
| 4,041,431 A | | 8/1977 | Enoksen | |
| 4,482,867 A | * | 11/1984 | Marchand et al. | .......... 330/227 |
| 4,533,863 A | | 8/1985 | Luhn et al. | |
| 4,630,220 A | | 12/1986 | Peckinpaugh | |
| 4,761,702 A | | 8/1988 | Pinard | |
| 4,870,421 A | * | 9/1989 | Peil et al. | ................ 342/175 |
| 4,893,228 A | | 1/1990 | Orrick et al. | |
| 5,070,538 A | | 12/1991 | Milberger et al. | |
| 5,117,174 A | | 5/1992 | Kessler | |
| 5,170,493 A | | 12/1992 | Roth | |
| 5,187,427 A | | 2/1993 | Erdman | |
| 5,264,782 A | | 11/1993 | Newton | |
| 5,298,851 A | | 3/1994 | DeNardis | |
| 5,336,986 A | | 8/1994 | Allman | |
| 5,359,276 A | | 10/1994 | Mammano | |
| 5,652,539 A | * | 7/1997 | Zanders et al. | .......... 327/539 |
| 5,672,959 A | | 9/1997 | Der | |
| 5,938,769 A | | 8/1999 | Hu | |
| 5,940,785 A | | 8/1999 | Georgiou et al. | |
| 5,943,224 A | | 8/1999 | Mao | |
| 5,959,852 A | | 9/1999 | Deloy et al. | |
| 6,031,421 A | | 2/2000 | McEwan | |
| 6,037,759 A | | 3/2000 | Chen et al. | |
| 6,114,817 A | | 9/2000 | Fernsler | |
| 6,130,575 A | | 10/2000 | Nelson et al. | |
| 6,160,591 A | | 12/2000 | Stumfall et al. | |
| 6,181,116 B1 | | 1/2001 | Jansen | |
| 6,188,206 B1 | | 2/2001 | Nguyen et al. | |
| 6,211,661 B1 | | 4/2001 | Eckhardt | |
| 6,232,893 B1 | | 5/2001 | Cliff et al. | |
| 6,246,221 B1 | | 6/2001 | Xi | |
| 6,304,131 B1 | | 10/2001 | Huggins et al. | |
| 6,366,062 B2 | * | 4/2002 | Baretich et al. | ............ 323/223 |

OTHER PUBLICATIONS

"An on–chip 96.5% current efficiency CMOS linear regulator using a flexible control techinque of output current", Endoh, T.; Sunaga, K.; Sakuraba, H; Masuoka, F., Solid–State Circuits, IEEE Journal of , vol.: 36 Issue: 1 , Jan. 2001, page(s): 34–39.*

* cited by examiner

Primary Examiner—John B. Sotomayor
(74) Attorney, Agent, or Firm—Hunton & Williams (57) ABSTRACT

A power regulator regulates the power provided to a transistor-based circuit, such as that which might be employed in a high stability MTI radar system. According to the invention, a variable reference voltage is controlled based on the frequency of operation. The output voltage of the power regulator is then modified accordingly. Preferably, the reference voltage is controlled based on the location of the target frequency in relation to the overall operational frequency band, which has been divided into a series of sub-bands.

33 Claims, 6 Drawing Sheets

PROGRAMMABLE POWER REGULATOR FOR MEDIUM TO HIGH POWER RF AMPLIFIERS WITH VARIABLE FREQUENCY APPLICATIONS

FIELD OF THE INVENTION

The present invention relates generally to a regulator for RF amplifiers used in variable frequency applications.

BACKGROUND OF THE INVENTION

One commonly known fact about most microwave RF transistors is they usually have more gain at lower frequencies than at higher frequencies. Therefore, microwave transistors used in variable frequency applications will vary in gain as their operating frequency changes from the low end of the frequency band to the high end of the frequency band. For applications that require performance over a wide frequency band, this can be a significant problem. For example, frequency variation in transistor gain can be extremely problematic for high stability applications that require a flat (frequency independent) gain response, such as for Moving Target Indicator (MTI) pulse-type radar systems.

Because of this difficulty, a very important parameter in the design of any microwave preamplifier/amplifier assembly used in variable frequency applications is the amount of allowable gain difference across the frequency band. One approach to solving this problem is to specify a maximum allowable gain difference for the transistors (for example, 1 dB across the frequency band). The parts are then screened to that specification. However, this approach can be extremely expensive, especially in large part count devices where there may be many RF amplifiers in parallel in a circuit. This approach also has the disadvantage that it may preclude the use of commercial-off-the-shelf (so-called "COTS") components altogether. This can greatly increase manufacturing costs to the point of impracticality.

Another approach is to simply relax the power out delta requirements across the band and use COTS transistors. However, this will degrade the performance of the amplifier and system across the operating band.

If COTS transistors are used, a conventional linear regulator can be used to regulate the voltage provided to the preamplifier/amplifier. In a typical linear regulator, the voltage is preset to a predetermined voltage ("reference voltage") for normal operation. In some cases this voltage is tunable so that a more accurate voltage can be set when the load is applied. Generally, however, once the regulator output voltage is set it does not change during normal operation. Accordingly, a conventional linear regulator used with COTS transistors will lead to the same problems discussed above regarding the variation of the system output response with frequency. In high stability, frequency-variable applications, like MTI radar, this is a significant drawback that degrades system performance.

Additionally, a linear regulator output voltage will tend to decrease in value during load pulses due to the "droop" in the output capacitor voltage. This droop in the output voltage causes a slight decrease in RF transistor power output, thereby adding to (exacerbating) an already decreasing output power as frequency increases.

Figure 1:
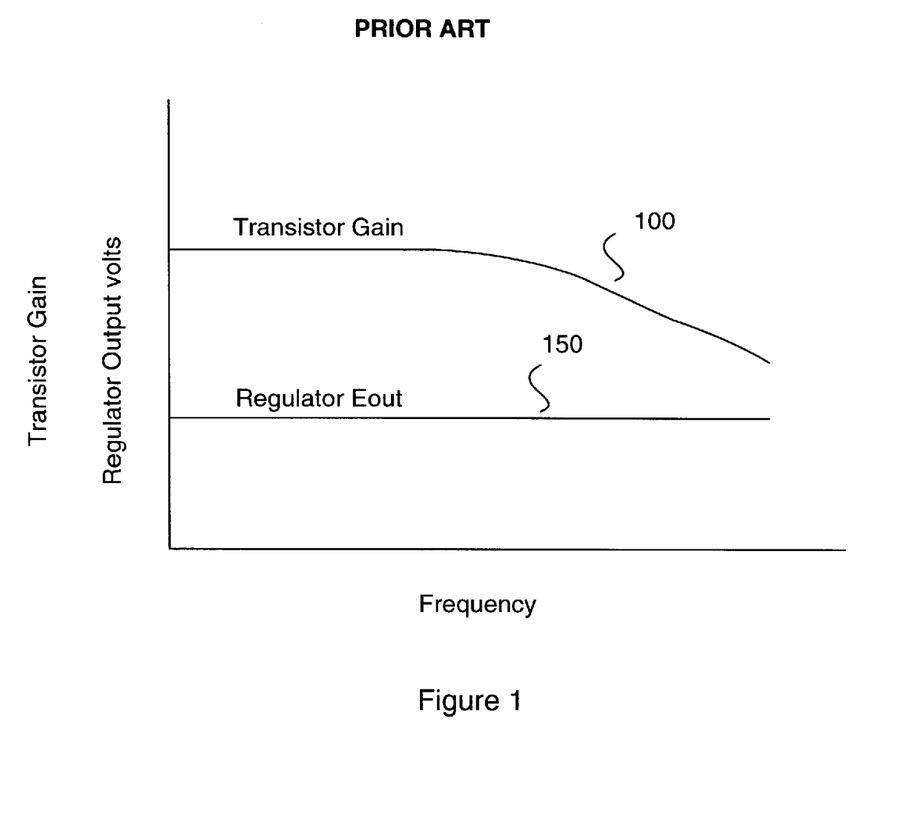
FIG. 1 is a graph illustrating the difficulties presented in prior art approaches to providing power to frequency variable electronic circuits.

FIG. 1 (not to scale) generally illustrates the difficulty posed in the prior art. At microwave frequencies, a typical transistor gain falls off at the higher frequencies, while the linear regulator voltage output remains more or less constant. The net effect at the system level is that the system response at higher frequencies will be significantly less than at the lower frequencies. FIG. 1 illustrates the problem in one context (microwave frequency performance of transistors).

It can readily be appreciated that the problem exists in other contexts. For example, instead of a transistor, there may be some other component, device, or system, whose output response or gain exhibits some variation with frequency. Also, the variation of this output response or gain may increase with frequency, decrease with frequency, or increase and decrease with frequency at different points in the spectrum. Finally, the frequency span of interest can be other than microwave frequencies. The common problem is that of how to control, or compensate for, the frequency variable output response in order to render the desired effective response. Generally, the desired effective response is flat over an operational frequency band for the system at issue. Sometimes, a non-flat response may be desired.

Other problems and drawbacks also exist.

SUMMARY OF THE INVENTION

An embodiment of the present invention comprises a power regulator for regulating the power provided to a transistor-based circuit, such as that which might be employed in a high stability MTI radar system. According to the invention, a variable reference voltage is controlled based on the frequency of operation. The output voltage of the power regulator is then modified accordingly. Preferably, the reference voltage is controlled based on the location of the target frequency in relation to the overall operational frequency band, which has been divided into a series of sub-bands.

According to another aspect of the invention, a power regulator is provided having an input circuit for providing inputs pertaining to frequency; a control circuit for determining a modified reference voltage or voltage offset; an error amplifier or differential amplifier for modifying the output voltage; a pass-through circuit for passing the output voltage; and a discharge circuit for discharging the output voltage.

According to another aspect of the invention, methods are provided for regulating power provided to a transistor-based circuit. According to one embodiment, the operational frequency band is divided up into a series of sub-bands. The power regulator output voltage is then controlled based on a specific (target) frequency. The output response of the transistor-based circuit is maintained as substantially uniform over frequency. According to another embodiment, input values are provided that correspond to a target frequency. A modified output voltage is computed that is appropriate for the target frequency. A modified output voltage for the voltage regulator is computed, and the reference voltage is modified accordingly. The output response is maintained as substantially independent of transistor gain variations across frequency.

Accordingly, it is one object of the present invention to overcome one or more of the aforementioned and other limitations of existing systems and methods for addressing gain variations in frequency variable circuits.

It is another object of the invention to provide a power regulator that solves or mitigates the problem of the variable frequency response of electronic circuits, such as transistor-based circuits.

It is another object of the invention to provide a power regulator that solves or mitigates the problem of the variable frequency response in transistor-based circuits so that COTS transistors can be used without special screening procedures.

It is another object of the invention to provide a power regulator for use in high stability radar systems so that the system response over the frequency range of interest remains substantially constant.

It is another object of the invention to provide methods for regulating power so that the power provided to variable frequency response circuits compensates for that frequency-dependence so as to render an overall substantially flat system frequency response.

The accompanying drawings are included to provide a further understanding of the invention and are incorporated in and constitute part of this specification, illustrate several embodiments of the invention and, together with the description, serve to explain the principles of the invention. It will become apparent from the drawings and detailed description that other objects, advantages and benefits of the invention also exist.

Additional features and advantages of the invention will be set forth in the description that follows, and in part will be apparent from the description, or may be learned by practice of the invention. The objectives and other advantages of the invention will be realized and attained by the system and methods, particularly pointed out in the written description and claims hereof as well as the appended drawings.

BRIEF DESCRIPTION OF THE DRAWINGS

The purpose and advantages of the present invention will be apparent to those of skill in the art from the following detailed description in conjunction with the appended drawings in which like reference characters are used to indicate like elements, and in which.

DETAILED DESCRIPTION OF THE INVENTION

Figure 2:
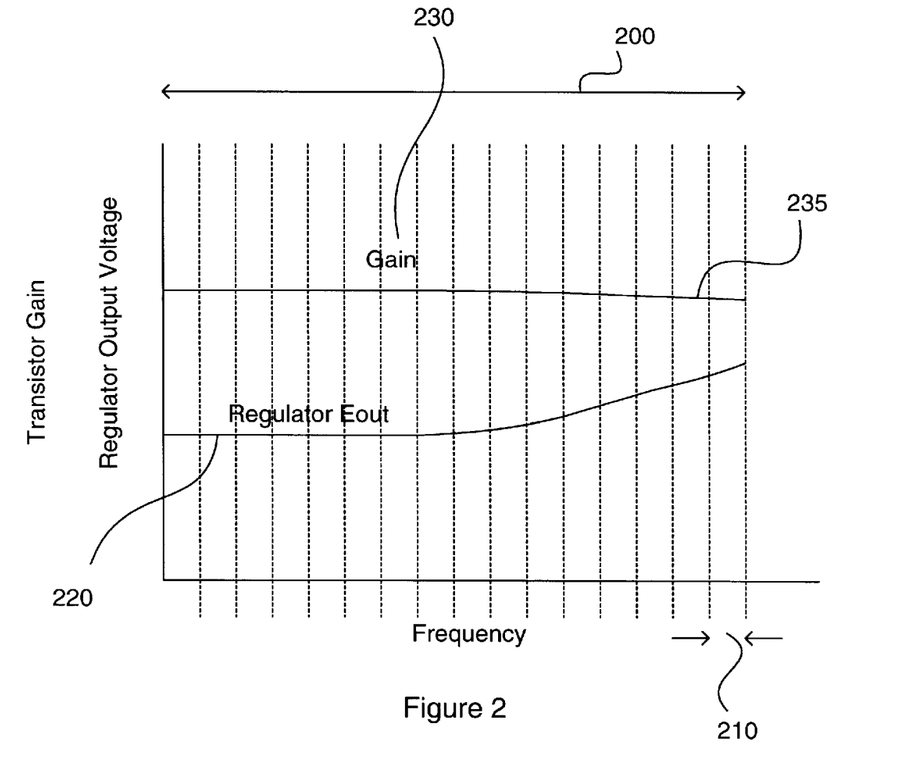
FIG. 2 is a graph illustrating an example of subdividing of an operational frequency band into sub-bands so that power output can be adjusted according to frequency.

FIG. 2 is a graph, according to an embodiment of the invention, which illustrates gain 230 and regulator voltage output 220 as a function of frequency. Gain 230 refers to the gain of any component, device, or system that is driven or regulated by a regulator, and which exhibits some frequency variability. In the preferred embodiment, gain 230 refers to the effective gain of a transistor-based circuit.

Operational frequency band 200 represents the overall operating range of the component, device, or system that is being driven or regulated. Operational frequency band 200 can be centered at various frequencies and can be continuous or not continuous. For example, operational frequency band 200 could start near DC or could start at an elevated microwave frequency. Operational frequency band 200 could include gaps where the component, device, or system is not operable due to safety, performance, FCC regulations, or other considerations.

According to an embodiment of the invention, the operational frequency band 200 can be broken into or divided up into a series of sub-bands 210. Operational frequency band 200 can be divided up in various fashions, such as equally or not equally. In the latter case, frequency band 200 can be divided up linearly or nonlinearly. For example, frequency band 200 can be divided up so that sub-bands 210 tend to increase or decrease in width as frequency increases. Frequency band 200 can be divided up so that sub-bands 210 increase logarithmically. Alternatively, frequency band 200 can be divided up so that certain sub-bands are very wide (for example, in frequency spans where there is little gain variation) while other sub-bands are very narrow (for example, in frequency spans where there is considerable gain variation). Those of skill in the art will appreciate that there are other approaches within the scope and spirit of the invention for dividing up or breaking up operational frequency band 200 in order to implement the invention.

As illustrated in FIG. 2, regulator voltage output 220 is controlled to change its value as a function of frequency. Regulator voltage output 220 refers to the output voltage of any device for driving or regulating an electronic circuit. For example, regulator voltage output 220 describes the voltage output of a programmable regulator. Preferably, regulator voltage output 220 describes the voltage output of a programmable linear regulator, although a nonlinear regulator (such as a regulator that responds logarithmically) could be employed in the invention.

In accordance with the invention, regulator voltage output 220 is controlled as a function of the location or position of the operating frequency (target frequency) in the overall operational frequency band 200. As illustrated in the exemplary graph of FIG. 2, regulator voltage output 220 is increased in the upper frequency range 235 in order to offset or compensate for an otherwise decreasing gain of the component, device, or system at issue (e.g., the transistor gain of FIG. 1). As a result, the effective gain 230 remains nearly constant over the overall operational frequency band 200.

Without the benefit of the present invention, gain 230 could be changing (e.g., increasing or decreasing) over frequency. For example, gain 230 could relate to the gain of a transistor that tends to fall off at elevated frequencies, such as a transistor used in high stability pulsed radar systems. As previously indicated, gain 230 could relate to the gain of another component, device, or system that otherwise exhibits a frequency-dependent response over the frequency span of interest.

According to an embodiment, the operation of the programmable regulator may be as follows. Individual sub-bands 210 (also referred to as "segments") can be numbered with a numerical code or otherwise designated. Based on a present or expected target frequency, one of these codes can be identified or selected. Based on the code, the reference voltage for the regulator can be changed or offset to force its output voltage 220 to a new value. For example, an offset can be applied to adjust the reference voltage to other than its preset value. This output voltage 220 of the voltage regulator is then applied to the source of the component, device, or system, such as to the source (e.g., a collector or a drain voltage) of a microwave transistor.

According to an embodiment, the programmable regulator can be controlled to maintain the effective gain 230 within some design criteria over the operational frequency band 200. This design criteria or window may have different values, depending on the application. Preferably, the programmable regulator is controlled to maintain the output response within 1 dB of nominal. In radar applications, this reduces part costs and manufacturing costs, and provides better radar performance.

Figure 3:
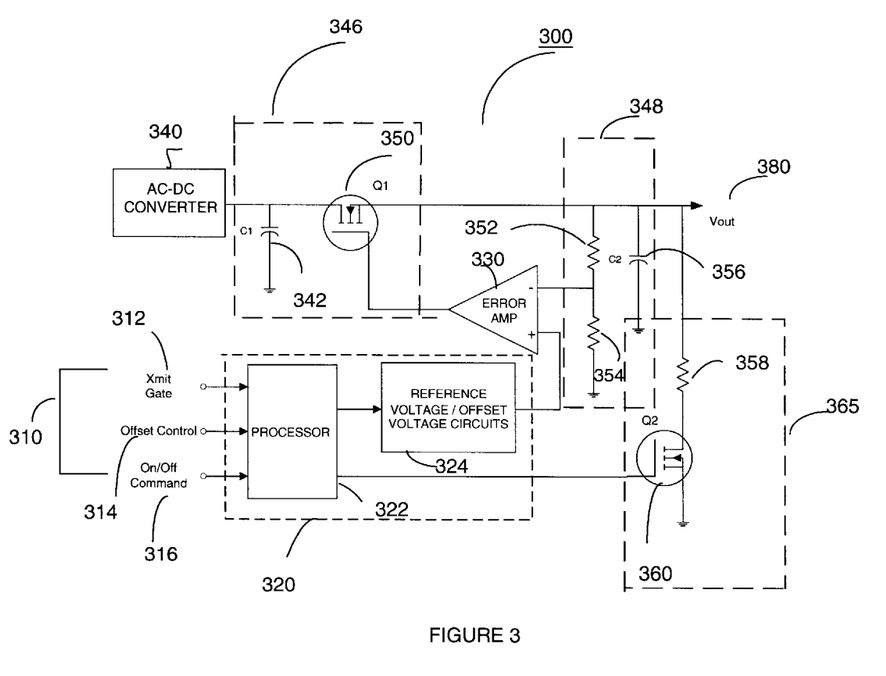
FIG. 3 is a block diagram of an exemplary power regulator according to an embodiment of the invention.

FIG. 3 is a block diagram of a programmable regulator 300 in accordance with an embodiment of the invention. The preferred programmable regulator 300 includes the following: inputs 310; control circuitry 320; feedback element 330; AC-DC converter 340; pass-through circuitry 346; output elements 348; discharge circuit 365; and output voltage 380.

Inputs 310 are data inputs or signal inputs to programmable regulator 300. Inputs 310 may be received from a system interface (not shown). Inputs 310 include data inputs or signal inputs identifying, designating, or indicating a target frequency (or a change from an existing frequency). According to an embodiment, inputs 310 include inputs for transmit timing information, frequency control, and on/off commands. Preferably, inputs 310 include a transmit gate 312 input; an offset control 314 input; and an on/off command 316 input.

Offset control 314 input communicates information relating to the target frequency or a change in frequency. For example, offset control 314 could communicate a code indicative of the sub-band corresponding to a target frequency. Alternatively, offset control 314 could communicate a value quantifying a target frequency or a change in frequency, which is converted by control circuitry 320.

Control circuitry 320 controls the change in reference voltage based on the data/signals received via inputs 310. Preferably, control circuitry 320 modifies the reference voltage based on a change in target frequency. In a preferred embodiment, control circuitry 320 comprises processor 322 and reference voltage/offset voltage circuits 324. Preferably, processor 322 includes waveform generating circuits. For example, in one operative bread board implementation, a computer with a waveform generator was used to develop the offset voltage according to a scan program.

Processor 322 receives inputs 310 and determines what the output voltage 380 of programmable regulator 300 should be. Preferably, processor 322 also converts its output from digital to analog before passing that output to reference voltage/offset voltage circuits 324. According to one embodiment, processor 322 passes an analog value defining the new target output voltage 380. Of course, processor 322 could pass a digital value, or could pass a value representing, for example, a change or delta in target output voltage 380.

Reference voltage/offset voltage (RVOV) circuits 324 instigates the change to the output voltage 380. RVOV circuits 324 may perform this by modifying the reference voltage of programmable regulator 300. For example, RVOV circuits 324 may compute an offset voltage to be applied to a present reference voltage in order to derive a new reference voltage.

The output of control circuitry 320, which may be a new reference voltage, is applied to a feedback element 330. Feedback element 330 causes a change in output voltage 380 based on an input provided by control circuitry 320. According to an embodiment, feedback element 330 is an error amplifier or differential amplifier.

The output of feedback element 330 is supplied to pass-through circuitry 346. Pass-through circuitry 346 receives a power input from AC-DC converter 340 and passes a regulated voltage through to the output circuitry of programmable regulator 300. According to an embodiment, pass-through circuitry 346 comprises a capacitor 342 and a transistor 350. Capacitor 342 should be large enough to reduce input ripple voltage and pass transistor 350 may be of a low Rdson type Power FET to insure a low-voltage dropout level.

According to an embodiment, programmable regulator 300 includes output elements 348, including an output resistance. In this embodiment, this output resistance comprises a first resistance formed from resistors 352 and 354 on either side of one terminal of feedback element 330. This output resistance may also comprise a second resistor 358 in series with or forming part of a discharge circuit 365 (discussed below). According to one embodiment, resistor 352 and resistor 354 are scaled to represent the output voltage as found at output voltage 380.

Output elements 348 of programmable regulator 300 may also comprise an output capacitance. According to an embodiment, this output capacitance comprises a capacitor 356 disposed between output voltage 380 and ground, thereby carrying the load during non-transmit periods.

Overall, the programmable regulator must be sufficiently fast to change its output voltage 380 to accommodate changing frequencies. Accordingly, feedback element 330 and transistor 350 should be fast enough to support the particular application. Once the voltage is changed, the regulator must adequately regulate to the new voltage output 380 until it is commanded to change to another voltage level.

The value of the output capacitance (e.g., capacitor 356) is selected in order to achieve the proper balance between providing quick response times and adequately supporting output voltage 380 prior to the time that transmission begins, i.e., when voltage 380 is applied and current begins to flow. In order to change the value of the regulator output voltage quickly, a small output capacitance is preferred. On the other hand, the capacitance must be large enough to support the maximum output voltage 380.

According to one embodiment of programmable regulator 300, the output capacitance is considered large enough when it causes a minimum amount of droop during the transmit cycle [e.g., droop $E=I*t/C$]. According to one embodiment, the maximum droop requirement is about 0.5 volts or less and the value for the capacitor 356 is small in comparison to the value of capacitor 342 in pass-through circuit 346.

As shown in FIG. 3, programmable regulator 300 also includes discharge circuit 365 for discharging energy when output voltage 380 is to be reduced. Discharge circuit 365 may include resistor 358 and transistor 360. Preferably, in this arrangement resistor 358 is low enough in value so that the output voltage 380 can reach its new value prior to load turn-on. Transistor 360 is preferably a low Rdson type FET with sufficient power handling capability to avoid failure.

Changing of the output voltage of the regulator is done during a non-transmit time so that the regulator output voltage 380 remains constant during the transmit period. This causes the gain 230 (FIG. 2) to remain substantially constant during a transmit cycle at any particular target frequency.

Figure 4:
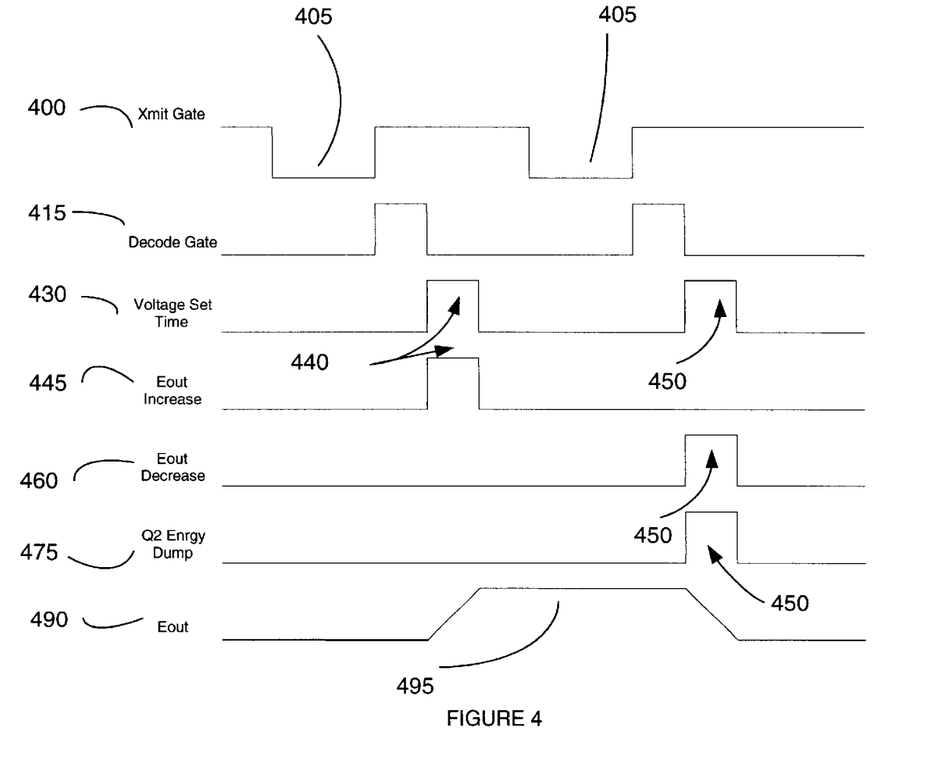
FIG. 4 is an exemplary timing sequence, according to an embodiment of the invention, for controlling a power regulator.

FIG. 4 is an exemplary timing sequence, according to an embodiment of the invention, for controlling a power regulator. For example, the timing sequence of FIG. 4 could describe the control and operation of the preferred power regulator 300 of FIG. 3 for purposes of radar applications.

Referring to FIG. 4, transmit gate 400 indicates the transmit cycles 405 when power is being supplied to a transistor-based circuit, such as a preamplifier or amplifier. For example, transmit gate 400 could be the transmit gate 312 input of FIG. 3.

Decode gate 415 indicates the point in time prior to a transmit cycle 405 when the parameters (e.g., target frequency, frequency offset, or sub-band code, etc.) are determined for the next transmission.

Voltage set time 430 designates the point in time 440 where the reference voltage is being established. If it is determined (based on frequency information) that a voltage offset should be applied, then Eout increase 445 may be effectuated during point in time 440. Preferably, voltage set time 430 and Eout increase 445 occur at a point in time 440 coinciding with a non-transmit period, as illustrated in FIG. 4.

Voltage set time 430 may also designate a second point in time 450 when the reference voltage is being established. If it is determined that a (negative) voltage offset should be applied, then Eout decrease 460 may be effectuated during second point in time 450. Preferably, Eout decrease 460 occurs at a second point in time 450 coinciding with a non-transmit period, as illustrated in FIG. 4.

During non-transmit periods when the reference voltage is being reduced, Q2 energy dump 475 may designate the dumping or dissipation of energy, such as during second point in time 450. This operation could be carried out by the preferred discharge circuit 365 of FIG. 3.

Finally, Eout 490 illustrates the profile of the regulator output voltage. For example, Eout 490 could represent the voltage output 380 of FIG. 3. It can be seen from voltage profile 495 of FIG. 4 that the voltage is constant during transmit period 405.

Figure 5:
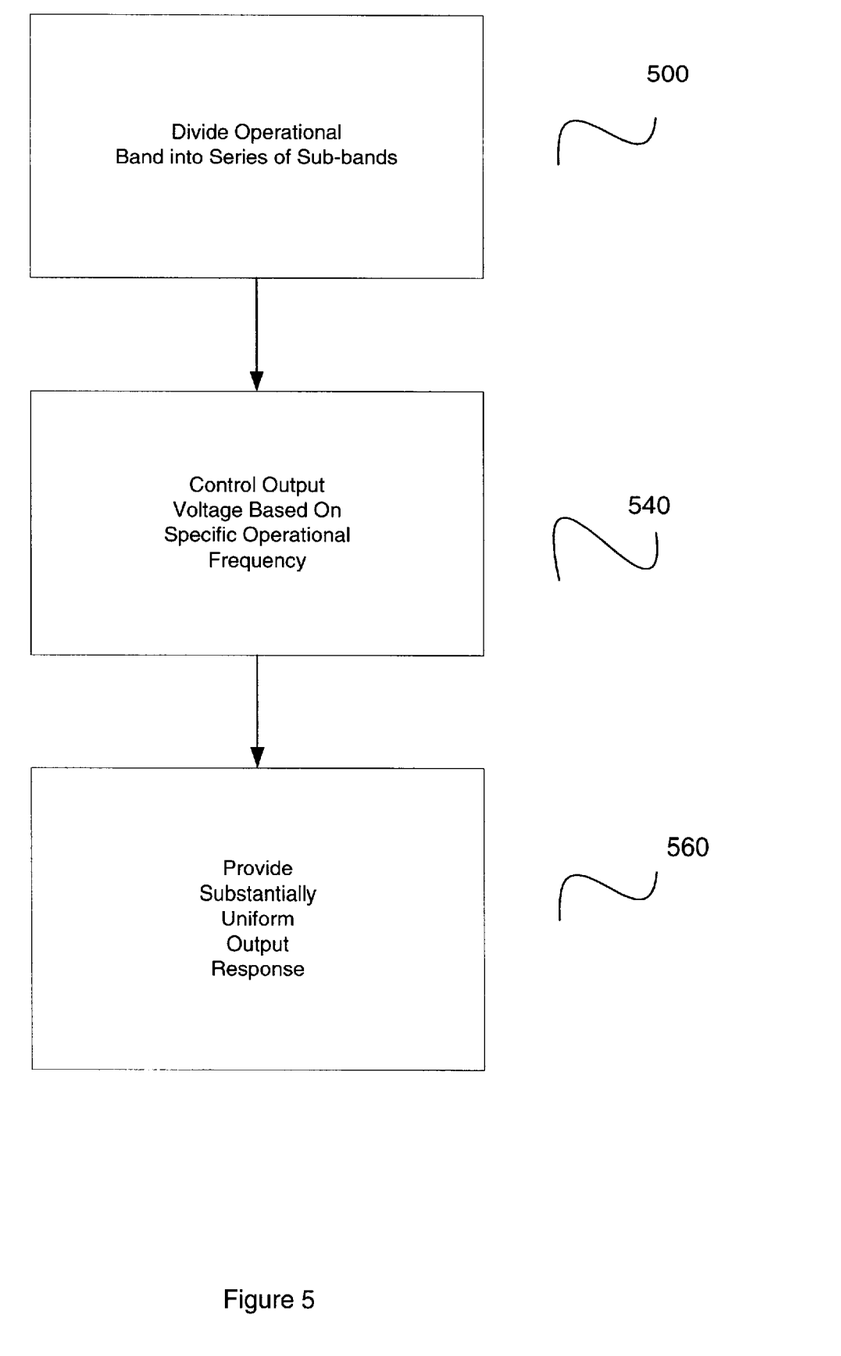
FIG. 5 is an exemplary flow diagram of a method according to an embodiment of the invention for controlling a power regulator.

FIG. 5 is an exemplary flow diagram of a method according to an embodiment of the invention for controlling a power regulator. Step 500 provides for dividing the operational (frequency) band into a series of sub-bands. According to step 540, the voltage output of a regulator is controlled based on a specific (target) operational frequency. As previously discussed, the specific operational frequency could be represented as the new target frequency (or a code or other designation) or a change/delta in target frequency (or a code or other designation). According to step 560, the component, device, or system provides a substantially uniform response. As previously discussed, the goal could be a nonuniform output response profile, rather than a uniform, e.g., flat, profile.

Figure 6:
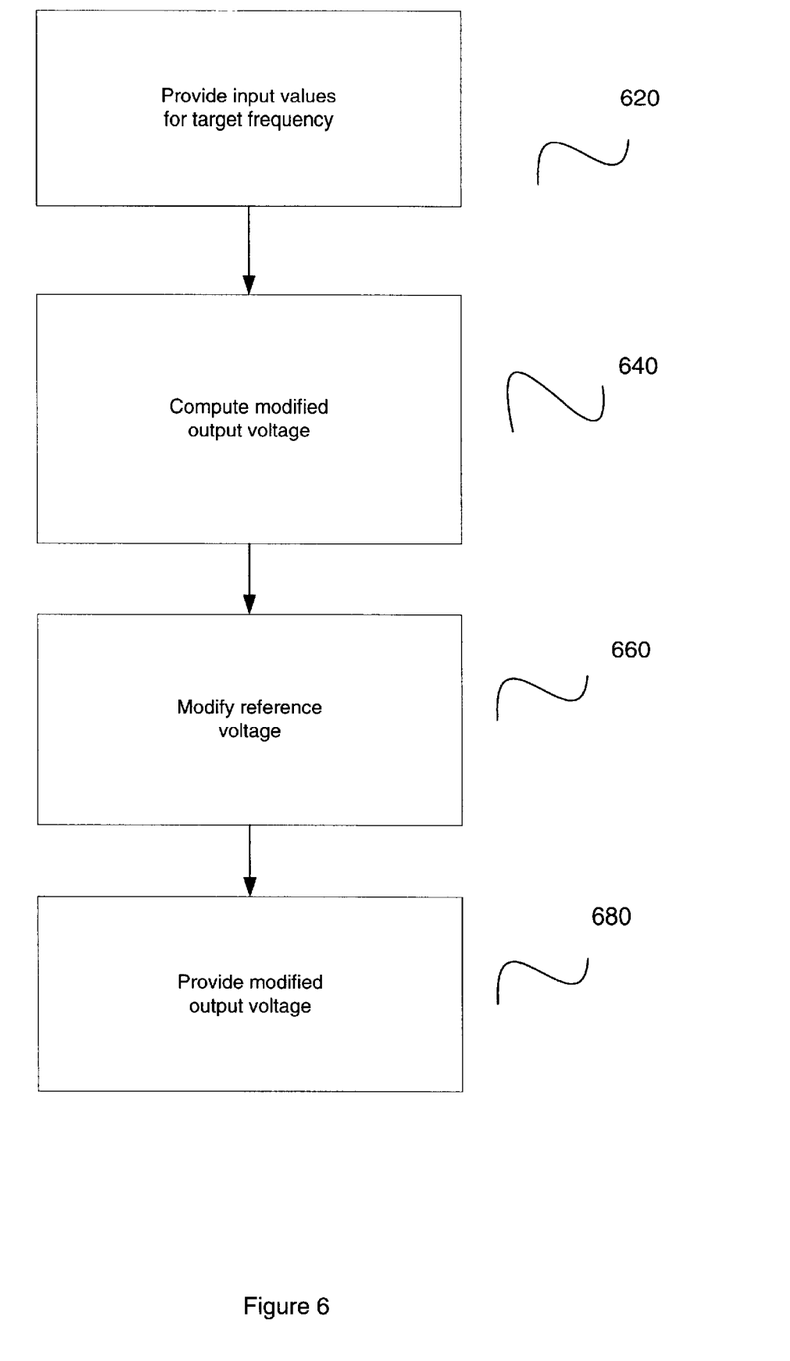
FIG. 6 is an exemplary flow diagram of a method according to another embodiment of the invention for controlling a power regulator.

FIG. 6 is an exemplary flow diagram of a method according to another eembodiment of the invention. According to step 620, input values for the target frequency (or change/delta) are provided. In step 640, a modified output voltage is computed or determined. According to step 660, the reference voltage of a regulator is modified. In step 680, a modified output voltage is provided.

Having described systems and methods for improved control over variable frequency response systems, a number of beneficial applications are evident. Generally, the programmable regulator could be used in any application where a change in the output voltage from its preset value would cause a positive response in the load. Causing the change in the output voltage can be logarithmic or linear in function. The regulator output could also be more random in nature should a particular load response require it.

A number of potential advantages to the invention exist, including but not limited to: allowing the use of COTS transistors; reducing the cost of RF amplifiers; improving the performance of an RF amplifier over more expensive RF transistors; reducing the requirement for Automatic Noise Limiting (ANL) in a receiver; compensating for gain differences vs. frequency in RF Transistors; compensating for gain variations in the following stage(s) of a system (such as when used in a cascaded RF amplifier design); improving system performance, such as by increasing the average power of each pulse in a pulsed radar system; providing high fidelity inputs to successive stages; providing feed forward input to a linear regulator; rendering the equivalent series resistance (ESR) of capacitors used in the output of a regulator is less critical; reducing the output capacitor size so as to allow for a larger input capacitor to provide a local source of high energy; allowing for smaller size wire to be used for bus interconnects; reducing input bus electromagnetic interference (EMI) because high inductive filtering can be applied without compromising transient response; and allowing for the reduction of front-end power supply bandwidth characteristics to less stringent characteristics, thereby reducing the cost of system input power supplies. Other embodiments and uses of this invention will be apparent to those having ordinary skill in the art upon consideration of the specification and practice of the invention disclosed herein. The specification and examples given should be considered exemplary only, and it is contemplated that the appended claims will cover any other such embodiments or modifications as fall within the true scope of the invention.

What is claim is:

1. A power regulator for regulating power provided to a transistor-based circuit, comprising:
   means for controlling a variable reference voltage based on a frequency of operation; and
   means for modifying an output voltage based on a change in the frequency of operation,
   wherein the means for controlling controls the variable reference voltage based on a target frequency and an operational frequency band that has been divided into sub-bands.

2. The power regulator of claim 1, wherein the transistor-based circuit is a solid state preamplifier or a solid state amplifier.

3. The power regulator of claim 1, wherein the transistor-based circuit is used to drive a pulse-type radar system.

4. The power regulator of claim 2, wherein the means for modifying an output voltage limits the variation in the gain of the transistor-based circuit to a design parameter.

5. The power regulator of claim 4, wherein the design parameter is about 1 dB across an operational frequency range.

6. The power regulator of claim 1, wherein the power regulator is used to compensate for frequency-variable transistor gain so as to effectively render the transistor gain substantially uniform over a frequency range of interest.

7. A power regulator for regulating power provided to a transistor-based circuit, comprising:
   means for controlling a variable reference voltage based on a frequency of operation; and
   means for modifying an output voltage based on a change in the frequency of operation,
   wherein the means for controlling controls the variable reference voltage based on the location of a target frequency within a series of sub-bands, wherein the series of sub-bands comprise the operational frequency band of the power regulator.

8. The power regulator of claim 7, wherein the means for controlling comprises control circuitry that determines a new output voltage and modifies the reference voltage based on the new output voltage.

9. The power regulator of claim 7, wherein the means for controlling comprises a processor and a reference and offset voltage circuit.

10. The power regulator of claim 7, wherein the means for modifying an output voltage comprises an error amplifier or differential amplifier for comparing a computed offset voltage or a computed reference voltage to an existing offset voltage or an existing reference voltage.

11. The power regulator of claim 7, wherein the means for modifying an output comprises a pass-through circuit.

12. The power regulator of claim 11, wherein the pass-through circuit comprises a first transistor and a first capacitor.

13. The power regulator of claim 7, wherein the means for modifying an output comprises an output capacitor.

14. The power regulator of claim 13, wherein the means for modifying an output further comprises an output resistance.

15. The power regulator of claim 14, wherein the output resistance comprises a first resistance in parallel with the output capacitor, and a second resistance, wherein a first portion of the second resistance defines a first voltage at the negative input of a differential amplifier, and wherein a second portion of the second resistance defines a voltage drop corresponding to the difference between the output voltage and the first voltage.

16. The power regulator of claim 7, wherein the means for modifying an output comprises a discharge circuit.

17. The power regulator of claim 16, wherein the discharge circuit comprises a second transistor and a second resistor.

18. A frequency-adaptive power regulator for regulating power provided to a transistor-based circuit used in a pulsed radar system, comprising:
   an input circuit for providing an input regarding a frequency;
   a control circuit for determining a modified reference voltage or a modified offset voltage based on the input;
   an error amplifier or differential amplifier for modifying an output voltage;
   a pass-through circuit for passing the modified output voltage when the pulsed radar system is engaged; and
   a discharge circuit for discharging voltage when the output voltage is to be reduced.

19. The frequency-adaptive power regulator of claim 18, wherein the control circuit operates in accordance with the position of a target frequency relative to an operational frequency band that has been divided into a series of sub-bands.

20. The frequency-adaptive power regulator of claim 19, wherein the operational frequency band has been divided up linearly.

21. The frequency-adaptive power regulator of claim 20, wherein the operational frequency band has been divided so that each sub-band has an equal width.

22. The frequency-adaptive power regulator of claim 19, wherein the operational frequency band has been divided so that at least some sub-bands at a higher frequency have a smaller width than at least some sub-bands at a lower frequency.

23. The frequency-adaptive power regulator of claim 19, wherein the operational frequency band has been divided logarithmically.

24. The frequency-adaptive power regulator of claim 19, wherein a gain variation across the operational frequency band is constrained by the frequency-adaptive power regulator.

25. The frequency-adaptive power regulator of claim 24, wherein the gain variation is constrained to about 1 dB.

26. A method of regulating power provided to a transistor-based circuit, comprising:
   dividing an operational frequency band into a sub-bands;
   controlling a power regulator output voltage based on a specific frequency;
   wherein the power regulator output voltage is controlled in order to maintain a substantially uniform output response of the transistor-based circuit.

27. The method of claim 26, wherein the operational frequency band is divided into equal increments equally.

28. The method of claim 26, wherein the operational frequency band is divided logarithmically.

29. The method of claim 26, wherein the operational frequency band is divided so that the width of sub-bands tends to decrease with frequency.

30. The method of claim 26, wherein the step of controlling comprises determining an offset voltage to be applied to a reference voltage.

31. The method of claim 26, further comprising the step of applying the power regulator output voltage to an amplifier used to drive a pulse-type radar system.

32. The method of claim 26, wherein the output response does not vary more than 1 dB over the operational frequency band.

33. A method of regulating power provided to a transistor-based circuit, comprising:
   providing input values corresponding to a target frequency;
   computing a modified output voltage that is appropriate for the target frequency;
   modifying a reference voltage based on the modified output voltage; and
   providing the modified output voltage to the transistor-based circuit, thereby rendering an output response that is substantially independent of variations in transistor gain across frequency.

* * * * *